(12) United States Patent
Shimura et al.

(10) Patent No.: US 10,005,911 B2
(45) Date of Patent: *Jun. 26, 2018

(54) CURABLE COMPOSITION FOR PRINTED WIRING BOARD, AND CURED COATING AND PRINTED WIRING BOARD USING SAME

(71) Applicant: TAIYO INK MFG. CO., LTD., Hiki-gun (JP)

(72) Inventors: Masayuki Shimura, Hiki-gun (JP); Yoshiyuki Furuta, Hiki-gun (JP); Masao Yumoto, Hiki-gun (JP)

(73) Assignee: TAIYO INK MFG. CO., LTD., Hiki-gun (JP)

(*) Notice: Subject to any disclaimer, the term of this patent is extended or adjusted under 35 U.S.C. 154(b) by 0 days. days.

This patent is subject to a terminal disclaimer.

(21) Appl. No.: 15/028,955

(22) PCT Filed: Sep. 30, 2014

(86) PCT No.: PCT/JP2014/076102
§ 371 (c)(1),
(2) Date: Apr. 13, 2016

(87) PCT Pub. No.: WO2015/068499
PCT Pub. Date: May 14, 2015

(65) Prior Publication Data
US 2016/0251520 A1 Sep. 1, 2016

(30) Foreign Application Priority Data
Nov. 5, 2013 (JP) .................................. 2013-229678

(51) Int. Cl.
| | | |
|---|---|---|
| C09D 4/00 | (2006.01) | |
| C08F 2/48 | (2006.01) | |
| C09D 133/06 | (2006.01) | |
| H05K 3/28 | (2006.01) | |
| C09D 11/101 | (2014.01) | |
| C09D 11/322 | (2014.01) | |
| C09D 11/38 | (2014.01) | |
| C09D 5/00 | (2006.01) | |
| H05K 1/03 | (2006.01) | |
| C09D 7/40 | (2018.01) | |
| C09D 7/61 | (2018.01) | |
| H05K 3/34 | (2006.01) | |

(52) U.S. Cl.
CPC ............... C09D 4/00 (2013.01); C08F 2/48 (2013.01); C09D 5/00 (2013.01); C09D 7/40 (2018.01); C09D 7/61 (2018.01); C09D 11/101 (2013.01); C09D 11/322 (2013.01); C09D 11/38 (2013.01); C09D 133/066 (2013.01); H05K 1/0373 (2013.01); H05K 3/287 (2013.01); H05K 3/3452 (2013.01); H05K 2201/0209 (2013.01); H05K 2203/0759 (2013.01)

(58) Field of Classification Search
CPC ..... C09D 4/00; C08F 2/44; C08F 2/46; C08K 3/0033
See application file for complete search history.

(56) References Cited

U.S. PATENT DOCUMENTS

| | | | |
|---|---|---|---|
| 6,780,549 B2 | 8/2004 | Takeuchi et al. | |
| 9,182,665 B2* | 11/2015 | Shimura | ................. G03F 7/028 |
| 2006/0058412 A1 | 3/2006 | Kakinuma et al. | |
| 2008/0038570 A1 | 2/2008 | Satou et al. | |
| 2008/0078570 A1* | 4/2008 | Japp | ..................... H01L 23/145 174/256 |
| 2009/0087775 A1 | 4/2009 | Kunou et al. | |
| 2015/0064417 A1 | 3/2015 | Choi et al. | |

FOREIGN PATENT DOCUMENTS

| | | | | |
|---|---|---|---|---|
| JP | 5-7079 A | 1/1993 | | |
| JP | 5-7080 A | 1/1993 | | |
| JP | 5-7081 A | 1/1993 | | |
| JP | 8-211602 A | 8/1996 | | |
| JP | 2006-40935 A | 2/2006 | | |
| JP | 2007-332166 A * | 12/2007 | ........... | C09D 11/101 |
| JP | 2008-63556 A | 3/2008 | | |
| JP | 2008-238747 A | 10/2008 | | |
| JP | 2012-67222 A | 4/2012 | | |
| JP | 2012-214533 A | 11/2012 | | |
| JP | 2013-155245 A * | 8/2013 | ................ | C08F 2/44 |
| JP | 2014-185295 A | 10/2014 | | |
| WO | WO 00/55233 A1 | 9/2000 | | |
| WO | 2004/009272 A1 | 11/2004 | | |
| WO | 2013/146706 A1 | 10/2013 | | |

OTHER PUBLICATIONS

International Search Report dated Dec. 22, 2014 in PCT/JP14/76102 filed Sep. 30, 2014.
Extended Search Report dated Jun. 19, 2017 in European Patent Application No. 14860632.0.Ay.

* cited by examiner

Primary Examiner — Betelhem Shewareged
(74) Attorney, Agent, or Firm — Oblon, McClelland, Maier & Neustadt, L.L.P.

(57) ABSTRACT

Provided is a curable composition for a printed wiring board, which composition exhibits high physical strength as a coating film in terms of solder heat resistance, pencil hardness and the like and in which the components contained therein are not likely to precipitate in long-term storage even when the composition is configured to have a low viscosity and thereby made applicable to ink-jet printing, spin-coating and the like. The curable composition for a printed wiring board is characterized by comprising (A) a filler having a specific gravity of 3 or less, (B) a hydroxyl group-containing (meth)acrylate compound and (C) a photopolymerization initiator. The (A) filler having a specific gravity of 3 or less is preferably an inorganic filler.

20 Claims, No Drawings

CURABLE COMPOSITION FOR PRINTED WIRING BOARD, AND CURED COATING AND PRINTED WIRING BOARD USING SAME

TECHNICAL FIELD

The present invention relates to a curable composition for a printed wiring board. More particularly, the present invention relates to: a UV curable composition used in an ink-jet system; a coating film for a printed wiring board, which comprises the UV curable composition and forms at least one resist or marking; and a printed wiring board comprising a pattern obtained using the coating film.

BACKGROUND ART

In curable compositions for printed wiring boards such as solder resist, for the purpose of improving the physical strength of the coating films thereof, a method of adding a filler is commonly employed; however, in those compositions having such a low viscosity that makes the compositions applicable to an ink-jet method, a spin-coating method and the like, since precipitation of the filler occurs during long-term storage, there are problems of a change in the printability and deterioration of the coating film properties.

RELATED ART DOCUMENTS

Patent Documents

Patent Document 1: Japanese Unexamined Patent Application Publication No. H5-7079
Patent Document 2: Japanese Unexamined Patent Application Publication No. H5-7080
Patent Document 3: Japanese Unexamined Patent Application Publication No. H5-7081

SUMMARY OF THE INVENTION

Problems to be Solved by the Invention

However, in those compositions having such an extremely low viscosity that makes the compositions applicable to an ink-jet method, a spin-coating method and the like, since the filler easily precipitates, there are problems of a change in the printability and deterioration of the coating film properties caused by precipitation of the filler in long-term storage.

The present invention was made to solve the above-described problems in the prior art, and a main object of the present invention is to provide a curable composition for a printed wiring board, which composition exhibits high physical strength as a coating film in terms of solder heat resistance, pencil hardness and the like and in which the components contained therein are not likely to precipitate in long-term storage even when the composition is configured to have a low viscosity and thereby made applicable to ink-jet printing, spin-coating and the like.

Means for Solving the Problems

It was discovered that the above object of the present invention can be achieved by a curable composition for a printed wiring board, which is characterized by comprising a specific filler, a hydroxyl group-containing (meth)acrylate compound and a photopolymerization initiator.

That is, the curable composition for a printed wiring board according to the present invention is characterized by comprising: (A) a filler having a specific gravity of 3 or less; (B) a hydroxyl group-containing (meth)acrylate compound; and (C) a photopolymerization initiator.

In the curable composition for a printed wiring board according to the present invention, it is preferred that the (A) filler having a specific gravity of 3 or less be an inorganic filler.

Further, in the curable composition for a printed wiring board according to the present invention, it is preferred that particles contained therein have a maximum particle size of 0.1 to 5 µm or less.

It is also preferred that the curable composition for a printed wiring board according to the present invention further comprise a bifunctional (meth)acrylate compound.

Further, in the curable composition for a printed wiring board according to the present invention, it is preferred that the bifunctional (meth)acrylate compound have a viscosity of 5 to 50 mPa·s at 25° C.

It is also preferred that the curable composition for a printed wiring board according to the present invention further comprise a thermosetting component.

It is also preferred that the curable composition for a printed wiring board according to the present invention have a viscosity of 5 to 50 mPa·s at 50° C.

The cured coating film of the present invention is characterized in that it is obtained by photoirradiating any of the above-described curable compositions for a printed wiring board.

The printed wiring board of the present invention is characterized by comprising a pattern-cured coating film obtained by printing any of the above-described curable compositions for a printed wiring board on a substrate and subsequently photoirradiating the thus printed curable composition.

The printed wiring board of the present invention is characterized by comprising a pattern-cured coating film obtained by printing any of the above-described curable compositions for a printed wiring board on a substrate by an ink-jet printing method and subsequently photoirradiating the thus printed curable composition.

The printed wiring board of the present invention is characterized in that the above-described substrate is a plastic substrate.

Effects of the Invention

According to the present invention, a curable composition for a printed wiring board, which composition exhibits high physical strength as a coating film in terms of solder heat resistance, pencil hardness and the like and in which the components contained therein are not likely to precipitate in long-term storage even when the composition is configured to have a low viscosity and thereby made applicable to ink-jet printing, spin-coating and the like, can be provided. Further, the curable composition of the present invention is capable of yielding a cured coating film that is excellent in various properties such as adhesiveness to a substrate and the like, hardness and chemical resistance. Moreover, the curable composition of the present invention can be suitably used as an ink-jet composition.

MODE FOR CARRYING OUT THE INVENTION

The curable composition for a printed wiring board according to the present invention (hereinafter, also referred to as "curable composition") comprises: (A) a filler having a specific gravity of 3 or less (component A); (B) a hydroxyl group-containing (meth)acrylate compound (component B); and (C) a photopolymerization initiator (component C).

The term "(meth)acrylate" used herein is a general term for acrylates, methacrylates and mixtures thereof, and this is hereinafter applicable to all other similar expressions.

[(A) Filler Having Specific Gravity of 3 or Less]

As the (A) filler having a specific gravity of 3 or less, a known and commonly used filler can be used. The filler of the component (A) is preferably an inorganic filler; however, it may also be an organic filler.

Further, as the filler of the component (A), one which has a specific gravity of 1 to 3 is preferred.

Specific examples of the (A) filler having a specific gravity of 3 or less include aluminum hydroxide (specific gravity: 2.42), magnesium hydroxide (specific gravity: 2.3 to 2.4), talc (specific gravity: 2.7 to 2.8), silica (specific gravity: 2.2), magnesium carbonate (specific gravity: 2.98), calcium carbonate (specific gravity: 2.4 to 2.7), hydrotalcite (2.03 to 2.09), calcium hydroxide (2.21), sepiolite (2.0 to 2.3), calcium sulfate (2.96: anhydride or 2.36: dihydrate), kaolin (2.6), mica (2.8 to 3.0), magnesium sulfate (2.65), carbon black (1.8 to 2.1), fly ash (1.9 to 2.1) and wollastonite (2.9 to 3.0). By incorporating the filler having a specific gravity of 3 or less, precipitation in the curable composition for a printed wiring board can be inhibited and the coating film strength such as solder heat resistance and pencil hardness can be improved.

From the standpoint of inhibiting precipitation, it is preferred that the curable composition of the present invention contain substantially no filler having a specific gravity of higher than 3; however, this should not exclude a case where a filler having a specific gravity of higher than 3 is incorporated in such a range that does not adversely affect the properties of the curable composition of the present invention and the object of the present invention. As the filler having a specific gravity of higher than 3, a known and commonly used filler can be used. Specific examples of the filler having a specific gravity of higher than 3 include (the numbers in parentheses indicate the specific gravity) barium sulfate (4.5), titanium oxide (4), barium titanate (6.02), alumina (about 4), boehmite (3.04), zinc oxide (5.6), magnesium oxide (3.65), calcium oxide (3.35), potassium titanate (3.5), copper (8.74) and iron (7.87).

The (A) filler having a specific gravity of 3 or less is incorporated in an amount of preferably 5 to 30 parts by mass, more preferably 10 to 30 parts by mass, with respect to 100 parts by mass of the curable composition of the present invention. When the amount is 5 parts by mass or greater, the physical strength is expected to be improved, while when the amount is 30 parts by mass or less, deterioration of the (ink-jet) printability caused by an increase in viscosity or thixotropy can be suppressed.

Further, particles contained in the curable composition of the present invention have a maximum particle size of preferably 0.1 to 5 µm or less, more preferably 0.1 to 1 µm. The reason for this is that, when the maximum particle size is 0.1 µm or larger, the cohesive force of the particles is not overly strong, while when the maximum particle size is 5 µm or smaller, problems such as nozzle clogging during ink-jet printing is not likely to occur.

The maximum size of the particles contained in the composition can be measured using a particle size distribution analyzer, and the D100 value is defined as the maximum particle size.

[(B) Hydroxyl Group-Containing (Meth)acrylate Compound]

As the (B) hydroxyl group-containing (meth)acrylate compound, a low-molecular-weight material such as a monomer or an oligomer is used and specifically, a material having a molecular weight in a range of 100 to 1,000, preferably 110 to 700, is used.

Specific examples of the (B) hydroxyl group-containing (meth)acrylate compound include 2-hydroxy-3-acryloyloxypropyl (meth)acrylate, 2-hydroxy-3-phenoxyethyl (meth)acrylate, 1,4-cyclohexane dimethanol mono(meth)acrylate, 2-hydroxyethyl(meth)acrylate, 2-hydroxypropyl (meth)acrylate, 4-hydroxybutyl (meth)acrylate, pentaerythritol tri(meth)acrylate, dipentaerythritol monohydroxypenta (meth)acrylate and 2-hydroxypropyl (meth)acrylate. Examples of commercial products thereof include ARONIX M-5700 (manufactured by Toagosei Co., Ltd.; trade name); 4HBA, 2HEA and CHDMMA (all of which are manufactured by Nippon Kasei Chemical Co., Ltd.; trade names); BHEA, HPA, HEMA and HPMA (all of which are manufactured by Nippon Shokubai Co., Ltd.; trade names); and LIGHT ESTER HO, LIGHT ESTER HOP and LIGHT ESTER HOA (all of which are manufactured by Kyoeisha Chemical Co., Ltd.; trade names). As the (B) hydroxyl group-containing (meth)acrylate compound, the above-mentioned compounds and products may be used individually, or a plurality thereof may be used in combination.

Thereamong, particularly, 2-hydroxy-3-acryloyloxypropyl acrylate, 2-hydroxy-3-phenoxyethyl acrylate, 2-hydroxyethyl acrylate, 2-hydroxypropyl acrylate, 4-hydroxybutyl acrylate and 1,4-cyclohexane dimethanol monoacrylate can be preferably used. Further, a monofunctional (meth)acrylate compound can also be preferably used because of the easiness of adjusting its viscosity and the like.

The (B) hydroxyl group-containing (meth)acrylate compound is incorporated in an amount of preferably 5 to 50 parts by mass, more preferably 10 to 30 parts by mass, with respect to 100 parts by mass of the curable composition of the present invention. When the amount of the hydroxyl group-containing (meth)acrylate compound is 5 parts by mass or greater, superior adhesiveness, which is a characteristic feature of the composition of the present invention, is attained. Meanwhile, when the amount of the hydroxyl group-containing (meth)acrylate compound is 50 parts by mass or less, a reduction in the ink compatibility can be inhibited.

Because of a combination of the above-described components (A) and (B), even when the curable composition of the present invention has a low viscosity, the composition not only is unlikely to experience precipitation of the components contained therein during long-term storage, but also shows excellent adhesion to both a plastic substrate and a conductor circuit metal and exhibits excellent substrate protection performance as, for example, a resist ink for a printed wiring board (e.g., an etching resist ink, a solder resist ink or a plating resist ink). In addition, the curable composition of the present invention also exhibits excellent properties as a cured coating film even when it is cured at a low exposure dose.

[(C) Photopolymerization Initiator]

The (C) photopolymerization initiator is not particularly restricted and, for example, a photo-radical polymerization initiator can be used. As this photo-radical polymerization initiator, any compound can be used as long as it generates a radical when irradiated with light, laser, electron beam or the like and initiates a radical polymerization reaction.

Examples of the (C) photopolymerization initiator include benzoins and benzoin alkyl ethers, such as benzoin, benzoin methyl ether, benzoin ethyl ether and benzoin isopropyl ether; alkylphenone-based photopolymerization initiators such as 2-hydroxy-2-methyl-1-phenyl-propane-1-one; acetophenones such as acetophenone, 2,2-dimethoxy-2-phenylacetophenone, 2-diethoxy-2-phenylacetophenone and 1,1-dichloroacetophenone; aminoacetophenones such as 2-methyl-1-[4-(methylthio)phenyl]-2-morpholinopropane-1-one, 2-benzyl-2-dimethylamino-1-(4-morpholinophenyl)-butane-1-one and N,N-dimethylaminoacetophenone; anthraquinones such as 2-methylanthraquinone, 2-ethylanthraquinone, 2-t-butyl anthraquinone and 1-chloroanthraquinone; thioxanthones such as 2,4-dimethylthioxanthone, 2,4-diethylthioxanthone, 2-chlorothioxanthone and 2,4-diisopropylthioxanthone; ketals such as acetophenone dimethyl ketal and benzyl dimethyl ketal; 2,4,5-triaryl imidazole dimer; riboflavin tetrabutyrate; thiol compounds such as 2-mercaptobenzimidazole, 2-mercaptobenzoxazole and 2-mercaptobenzothiazole; organic halogen compounds such as 2,4,6-tris-s-triazine, 2,2,2-tribromoethanol and tribromomethylphenyl sulfone; benzophenones and xanthones, such as benzophenone and 4,4'-bis-diethylaminobenzophenone; acylphosphine oxide-based photopolymerization initiators such as 2,4,6-trimethylbenzoyldiphenylphosphine oxide and bis(2,4,6-trimethylbenzoyl)-phenylphosphine oxide; and titanocenes such as bis(cyclopentadienyl)-diphenyl-titanium, bis(cyclopentadienyl)-di-chloro-titanium, bis(cyclopentadienyl)-bis(2,3,4,5,6-pentafluorophenyl)titanium and bis(cyclopentadienyl)-bis(2,6-difluoro-3-(pyrrole-1-yl)phenyl)titanium.

These known and commonly used photopolymerization initiators may be used individually, or two or more thereof may be used as a mixture. Further, a photoinitiator aid, for example, a tertiary amine such as ethyl-N,N-dimethylaminobenzoate, isoamyl-N,N-dimethylaminobenzoate, pentyl-4-dimethylaminobenzoate, triethylamine or triethanolamine, can also be added.

Examples of commercially available photopolymerization initiators include IRGACURE 261, 184, 369, 651, 500, 819, 907, 784 and 2959, DAROCUR 1116 and 1173, CGI 1700, CGI 1750, CGI 1850 and CG-24-61, and LUCIRIN TPO and CGI-784 (all of which are manufactured by BASF Japan Ltd.; trade names); DAICAT II (manufactured by Daicel Chemical Industries, Ltd.; trade name); RHODORSIL Photoinitiator 2074 (manufactured by Rhodia; trade name); EBECRYL P36 (manufactured by UCB S.A.; trade name); and ESACURE KIP150, KIP65LT, KIP100F, KT37, KT55, KTO46, KIP75/B and ONE (all of which are manufactured by Fratelli Lamberti S.p.A; trade names).

The ratio of the (C) photopolymerization initiator to be incorporated is preferably in a range of 0.5 to 10 parts by mass with respect to 100 parts by mass of the curable composition of the present invention.

(Bifunctional (Meth)acrylate Compound)

It is preferred that the curable composition for a printed wiring board according to the present invention further comprise a bifunctional (meth)acrylate compound (with no hydroxyl group). By adding a bifunctional (meth)acrylate compound (with no hydroxyl group), the compatibility of the components contained in the curable composition for a printed wiring board can be further improved.

Specific examples of the bifunctional (meth)acrylate compound (with no hydroxyl group) include diol diacrylates such as 1,4-butanediol diacrylate, 1,6-hexanediol diacrylate, 1,9-nonanediol diacrylate and 1,10-decanediol diacrylate; glycol diacrylates, such as ethylene glycol diacrylate, diethylene glycol diacrylate, triethylene glycol diacrylate, tetraethylene glycol diacrylate, polyethylene glycol diacrylate, dipropylene glycol diacrylate, tripropylene glycol diacrylate, polypropylene glycol diacrylate, neopentyl glycol diacrylate, diol diacrylates obtained by adding at least one of ethylene oxide and propylene oxide to neopentyl glycol, and caprolactone-modified hydroxypivalic acid neopentyl glycol diacrylate; and diacrylates having a cyclic structure, such as bisphenol A EO-adduct diacrylate, bisphenol A PO-adduct diacrylate, tricyclodecane dimethanol diacrylate, hydrogenated dicyclopentadienyl diacrylate and cyclohexyl diacrylate.

Examples of commercially available bifunctional (meth)acrylate compounds include LIGHT ACRYLATE 1,6HX-A, 1,9ND-A, 3EG-A and 4EG-A (manufactured by Kyoeisha Chemical Co., Ltd.; trade names); HDDA, 1,9-NDA, DPGDA and TPGDA (manufactured by Daicel-Allnex Ltd.; trade names); VISCOAT #195, #230, #230D, #260, #310HP, #335HP and #700HV (manufactured by Osaka Organic Chemical Industry Ltd.; trade names); and ARONIX M-208, M-211B, M-220, M-225, M-240 and M-270 (manufactured by Toagosei Co., Ltd.; trade names).

Thereamong, from the standpoints of the viscosity and compatibility, diacrylates of diols containing an alkyl chain having 4 to 12 carbon atoms, particularly 1,4-butanediol diacrylate, 1,6-hexanediol diacrylate, 1,9-nonanediol diacrylate and 1,10-decanediol diacrylate are preferred.

Such a bifunctional acrylate compound is incorporated in an amount of preferably 20 to 80 parts by mass, more preferably 40 to 70 parts by mass, in 100 parts by mass of the curable composition of the present invention. When the amount of the bifunctional (meth)acrylate is 20 parts by mass or greater, the resulting ink has good compatibility. Meanwhile, when the amount is 80 parts by mass or less, the resulting ink has good adhesiveness.

The bifunctional (meth)acrylate compound has a viscosity at 25° C. of preferably 5 to 50 mPa·s, particularly preferably 5 to 30 mPa·s. In this viscosity range, the bifunctional (meth)acrylate compound shows good ease of handling as a diluent and can thus be mixed with the components homogeneously. As a result, the entire surface of the resulting coating film is expected to uniformly adhere to a substrate.

(Thermosetting Component)

A thermosetting component may be added to the curable composition of the present invention. By adding a thermosetting component, the adhesiveness and heat resistance are expected to be improved. Examples of the thermosetting component that can be used in the present invention include known thermosetting resins, for example, amino resins such as melamine resins, benzoguanamine resins, melamine derivatives and benzoguanamine derivatives; block isocyanate compounds; cyclocarbonate compounds; thermosetting components having a cyclic (thio)ether group(s); bismaleimides; and carbodiimide resins. Block isocyanate compounds are particularly preferred because of their excellent storage stability.

The above-described thermosetting components having a plurality of cyclic (thio)ether groups in one molecule are compounds that contain a plurality of one or two of 3-, 4- and 5-membered cyclic (thio)ether groups in one molecule. Examples thereof include compounds having a plurality of epoxy groups in one molecule, namely polyfunctional epoxy compounds; compounds having a plurality of oxetanyl groups in one molecule, namely polyfunctional oxetane compounds; and compounds having a plurality of thioether groups in one molecule, namely episulfide resins.

Examples of the polyfunctional epoxy compounds include, but not limited to, epoxidized vegetable oils such as ADK CIZER O-130P, ADK CIZER O-180A, ADK CIZER D-32 and ADK CIZER D-55, which are manufactured by ADEKA Corporation; bisphenol A-type epoxy resins such as jER828, jER834, jER1001 and jER1004, which are manufactured by Mitsubishi Chemical Corporation, EHPE3150 manufactured by Daicel Chemical Industries, Ltd., EPICLON 840, EPICLON 850, EPICLON 1050 and EPICLON 2055, which are manufactured by DIC Corporation, EPOTOHTO YD-011, YD-013, YD-127 and YD-128, which are manufactured by Tohto Kasei Co., Ltd., D.E.R. 317, D.E.R. 331, D.E.R. 661 and D.E.R. 664, which are manufactured by The Dow Chemical Company, SUMI-EPOXY ESA-011, ESA-014, ELA-115 and ELA-128, which are manufactured by Sumitomo Chemical Co., Ltd., and A.E.R. 330, A.E.R. 331, A.E.R. 661 and A.E.R. 664, which are manufactured by Asahi Chemical Industry Co., Ltd. (all of the above are trade names); a hydroquinone-type epoxy resin YDC-1312, a bisphenol-type epoxy resin YSLV-80XY and a thioether-type epoxy resin YSLV-120TE (all of which are manufactured by Tohto Kasei Co., Ltd.); brominated epoxy resins such as jERYL 903 manufactured by Mitsubishi Chemical Corporation, EPICLON 152 and EPICLON 165, which are manufactured by DIC Corporation, EPOTOHTO YDB-400 and YDB-500, which are manufactured by Tohto Kasei Co., Ltd., D.E.R. 542 manufactured by The Dow Chemical Company, SUMI-EPOXY ESB-400 and ESB-700, which are manufactured by Sumitomo Chemical Co., Ltd., and A.E.R. 711 and A.E.R. 714, which are manufactured by Asahi Chemical Industry Co., Ltd. (all of the above are trade names); novolac-type epoxy resins such as jER152 and jER154, which are manufactured by Mitsubishi Chemical Corporation, D.E.N. 431 and D.E.N. 438, which are manufactured by The Dow Chemical Company, EPICLON N-730, EPICLON N-770 and EPICLON N-865, which are manufactured by DIC Corporation, EPOTOHTO YDCN-701 and YDCN-704, which are manufactured by Tohto Kasei Co., Ltd., EPPN-201, EOCN-1025, EOCN-1020, EOCN-104S and RE-306, which are manufactured by Nippon Kayaku Co., Ltd., SUMI-EPOXY ESCN-195X and ESCN-220, which are manufactured by Sumitomo Chemical Co., Ltd., and A.E.R. ECN-235 and ECN-299, which are manufactured by Asahi Chemical Industry Co., Ltd., (all of the above are trade names); biphenol novolac-type epoxy resins such as NC-3000 and NC-3100, which are manufactured by Nippon Kayaku Co., Ltd.; bisphenol F-type epoxy resins such as EPICLON 830 manufactured by DIC Corporation, jER807 manufactured by Mitsubishi Chemical Corporation, and EPOTOHTO YDF-170, YDF-175 and YDF-2004, which are manufactured by Tohto Kasei Co., Ltd. (all of the above are trade names); hydrogenated bisphenol A-type epoxy resins such as EPOTOHTO ST-2004, ST-2007 and ST-3000 (trade names), which are manufactured by Tohto Kasei Co., Ltd.; glycidyl amine-type epoxy resins such as jER604 manufactured by Mitsubishi Chemical Corporation, EPOTOHTO YH-434 manufactured by Tohto Kasei Co., Ltd., and SUMI-EPOXY ELM-120 manufactured by Sumitomo Chemical Co., Ltd. (all of the above are trade names); hydantoin-type epoxy resins; alicyclic epoxy resins such as CELLOXIDE 2021 (trade name) manufactured by Daicel Chemical Industries, Ltd.; trihydroxyphenylmethane-type epoxy resins such as YL-933 manufactured by Mitsubishi Chemical Corporation, and T.E.N., EPPN-501 and EPPN-502, which are manufactured by The Dow Chemical Company (all of the above are trade names); bixylenol-type or biphenol-type epoxy resins and mixtures thereof, such as YL-6056, YX-4000 and YL-6121 (all of which are trade names) manufactured by Mitsubishi Chemical Corporation; bisphenol S-type epoxy resins such as EBPS-200 manufactured by Nippon Kayaku Co., Ltd., EPX-30 manufactured by ADEKA Corporation and EXA-1514 (trade name) manufactured by DIC Corporation; bisphenol A novolac-type epoxy resins such as jER157S (trade name) manufactured by Mitsubishi Chemical Corporation; tetraphenylolethane-type epoxy resins such as jERYL-931 (trade name) manufactured by Mitsubishi Chemical Corporation; heterocyclic epoxy resins such as TEPIC (trade name) manufactured by Nissan Chemical Industries, Ltd.; diglycidyl phthalate resins such as BLEMMER DGT manufactured by NOF Corporation; tetraglycidyl xylenoylethane resins such as ZX-1063 manufactured by Tohto Kasei Co., Ltd.; naphthalene group-containing epoxy resins such as ESN-190 and ESN-360, which are manufactured by Nippon Steel Chemical Co., Ltd., and HP-4032, EXA-4750 and EXA-4700, which are manufactured by DIC Corporation; epoxy resins having a dicyclopentadiene skeleton, such as HP-7200 and HP-7200H manufactured by DIC Corporation; glycidyl methacrylate copolymer-based epoxy resins such as CP-50S and CP-50M manufactured by NOF Corporation; cyclohexylmaleimide-glycidyl methacrylate copolymer epoxy resins; epoxy-modified polybutadiene rubber derivatives (e.g., PB-3600 manufactured by Daicel Chemical Industries, Ltd.); and CTBN-modified epoxy resins (e.g., YR-102 and YR-450 manufactured by Tohto Kasei Co., Ltd.). These epoxy resins may be used individually, or two or more thereof may be used in combination. Thereamong, novolac-type epoxy resins, bixylenol-type epoxy resins, biphenol-type epoxy resins, biphenol novolac-type epoxy resins, naphthalene-type epoxy resins and mixtures thereof are particularly preferred.

Examples of the polyfunctional oxetane compounds include polyfunctional oxetanes such as bis[(3-methyl-3-oxetanylmethoxy)methyl]ether, bis[(3-ethyl-3-oxetanylmethoxy)methyl]ether, 1,4-bis[(3-methyl-3-oxetanylmethoxy)methyl]benzene, 1,4-bis[(3-ethyl-3-oxetanylmethoxy)methyl]benzene, (3-methyl-3-oxetanyl)methyl acrylate, (3-ethyl-3-oxetanyl)methyl acrylate, (3-methyl-3-oxetanyl)methyl methacrylate, (3-ethyl-3-oxetanyl)methyl methacrylate, and oligomers and copolymers thereof; and etherification products of an oxetane alcohol and a hydroxyl group-containing resin such as a novolac resin, poly(p-hydroxystyrene), cardo-type bisphenols, calixarenes, calixresorcinarenes or silsesquioxane. Other examples include copolymers of an oxetane ring-containing unsaturated monomer(s) and an alkyl (meth)acrylate.

Examples of the compounds having a plurality of cyclic thioether groups in one molecule include a bisphenol A-type episulfide resin, YL7000 manufactured by Mitsubishi Chemical Corporation. Further, for example, an episulfide resin prepared by the same synthesis method, in which an oxygen atom of an epoxy group of a novolac-type epoxy resin is substituted with a sulfur atom, can also be used.

Examples of the amino resins such as melamine derivatives and benzoguanamine derivatives include methylol melamine compounds, methylol benzoguanamine compounds, methylol glycoluril compounds and methylol urea compounds. Further, alkoxymethylated melamine compounds, alkoxymethylated benzoguanamine compounds, alkoxymethylated glycoluril compounds and alkoxymethylated urea compounds can be obtained by converting the methylol group of the respective methylol melamine compounds, methylol benzoguanamine compounds, methylol glycoluril compounds and methylol urea compounds into an alkoxymethyl group. The type of this alkoxymethyl group is not particularly restricted and it may be, for example, a methoxymethyl group, an ethoxymethyl group, a propoxymethyl group or a butoxymethyl group. Particularly, human and environment-friendly melamine derivatives having a formalin concentration of 0.2% or less are preferred.

Examples of commercial products of these compounds include CYMEL 300, 301, 303, 370, 325, 327, 701, 266, 238, 1141, 272, 202, 1156, 1158, 1123, 1170, 1174, UFR65 and 300 (all of which are manufactured by Mitsui Cyanamid Co., Ltd.); and NIKALAC Mx-750, Mx-032, Mx-270, Mx-280, Mx-290, Mx-706, Mx-708, Mx-40, Mx-31, Ms-11, Mw-30, Mw-30HM, Mw-390, Mw-100LM and Mw-750LM (all of which are manufactured by Sanwa Chemical Co., Ltd.). These thermosetting components ay be used individually, or two or more thereof may be used in combination.

An isocyanate compound and a block isocyanate compound are compounds having a plurality of isocyanate groups or blocked isocyanate groups in one molecule. Examples of such a compound having a plurality of isocyanate groups or blocked isocyanate groups in one molecule include polyisocyanate compounds and blocked isocyanate compounds. The term "blocked isocyanate group" used herein refers to an isocyanate group that is protected and thus temporarily inactivated by a reaction with a blocking agent. When heated to a prescribed temperature, the blocking agent dissociates to yield an isocyanate group. It has been confirmed that, by adding the above-described polyisocyanate compound or blocked isocyanate compound, the curability of the curable composition and the toughness of the resulting cured product are improved.

As such a polyisocyanate compound, for example, an aromatic polyisocyanate, an aliphatic polyisocyanate or an alicyclic polyisocyanate can be used.

Specific examples of the aromatic polyisocyanate include 4,4'-diphenylmethane diisocyanate, 2,4-tolylene diisocyanate, 2,6-tolylene diisocyanate, naphthalene-1,5-diisocyanate, o-xylylene diisocyanate, m-xylylene diisocyanate and 2,4-tolylene dimer.

Specific examples of the aliphatic polyisocyanate include tetramethylene diisocyanate, hexamethylene diisocyanate, methylene diisocyanate, trimethylhexamethylene diisocyanate, 4,4-methylenebis(cyclohexylisocyanate) and isophorone diisocyanate.

Specific examples of the alicyclic polyisocyanate include bicycloheptane triisocyanate as well as adducts, biurets and isocyanurates of the above-mentioned isocyanate compounds.

As the blocked isocyanate compound, a product of addition reaction between an isocyanate compound and an isocyanate blocking agent can be used. Examples of an isocyanate compound that can react with a blocking agent include the above-described polyisocyanate compounds.

Examples of the isocyanate blocking agent include phenolic blocking agents such as phenol, cresol, xylenol, chlorophenol and ethylphenol; lactam-based blocking agents such as ε-caprolactam, δ-valerolactam, γ-butyrolactam and β-propiolactam; activated methylene-based blocking agents such as ethyl acetoacetate and acetylacetone; alcohol-based blocking agents such as methanol, ethanol, propanol, butanol, amyl alcohol, ethylene glycol monomethyl ether, ethylene glycol monoethyl ether, ethylene glycol monobutyl ether, diethylene glycol monomethyl ether, propylene glycol monomethyl ether, benzyl ether, methyl glycolate, butyl glycolate, diacetone alcohol, methyl lactate and ethyl lactate; oxime-based blocking agents such as formaldehyde oxime, acetaldoxime, acetoxime, methylethyl ketoxime, diacetyl monooxime and cyclohexane oxime; mercaptan-based blocking agents such as butylmercaptan, hexylmercaptan, t-butylmercaptan, thiophenol, methylthiophenol and ethylthiophenol; acid amid-based blocking agents such as acetic acid amide and benzamide; imide-based blocking agents such as succinic acid imide and maleic acid imide; amine-based blocking agents such as xylidine, aniline, butylamine and dibutylamine; imidazole-based blocking agents such as imidazole and 2-ethylimidazole; and imine-based blocking agents such as methyleneimine and propyleneimine.

The blocked isocyanate compound may also be a commercially available one and examples thereof include SUMIDUR BL-3175, BL-4165, BL-1100 and BL-1265, DESMODUR TPLS-2957, TPLS-2062, TPLS-2078 and TPLS-2117 and DESMOTHERM 2170 and 2265 (all of which are manufactured by Sumitomo Bayer Urethane Co., Ltd.); CORONATE 2512, CORONATE 2513 and CORONATE 2520 (all of which are manufactured by Nippon Polyurethane Industry Co., Ltd.); B-830, B-815, B-846, B-870, B-874 and B-882 (all of which are manufactured by Mitsui Takeda Chemicals Inc.); and TPA-B80E, 17B-60PX and E402-B80T (all of which are manufactured by Asahi Kasei Chemicals Corporation). It is noted here that SUMIDUR BL-3175 and BL-4265 are produced using methylethyl oxime as a blocking agent. The above-described compounds having a plurality of isocyanate groups or blocked isocyanate groups in one molecule may be used individually, or two or more thereof may be used in combination.

It is preferred that such a thermosetting component be incorporated in an amount of 1 to 30 parts by mass with respect to 100 parts by mass of the curable composition of the present invention. When the amount of the thermosetting component is 1 part by mass or greater, a coating film having sufficient toughness and heat resistance can be obtained. Meanwhile, when the amount is 30 parts by mass or less, a reduction in the storage stability can be inhibited.

In the curable composition for a printed wiring board according to the present invention, in addition to the above-described components, as required, known and commonly used additives, examples of which include a surface tension-adjusting agent; a surfactant; a matting agent; a polyester-based resin, a polyurethane-based resin, a vinyl-based resin, an acrylic resin, a rubber-based resin and a wax for adjusting the film physical properties, a known and commonly used coloring agent such as phthalocyanine blue, phthalocyanine green, iodine green, disazo yellow, crystal violet, titanium oxide, carbon black or naphthalene black; at least one of antifoaming agents and leveling agents such as silicone-based, fluorine-based or polymer-based one; and an adhesiveness-imparting agent such as an imidazole-based, thiazole-based or triazole-based silane-coupling agent, may also be incorporated.

Further, in the curable composition for a printed wiring board according to the present invention, in addition to the above-described components, a resin may also be incorporated in such an amount that does not adversely affect the properties of the curable composition. As the resin, any resin that is known and commonly used can be used; however, a (meth)acrylate compound having a polyene skeleton is preferred. The polyene skeleton is preferably formed by polymerization of, for example, either or both of polybutadiene and isoprene. It is particularly preferred that the polyene skeleton be constituted by repeating units represented by the Formula (I):

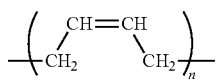

(wherein, n represents 10 to 300).

Because of the olefinic double bonds of the repeating units, the resulting curable resist composition for a printed wiring board is imparted with flexibility and an increased conformability to a substrate, so that good adhesiveness is attained.

In the polyene skeleton of the (meth)acrylate compound, the content of the repeating unit represented by the Formula (I) is preferably not less than 50%, more preferably not less than 80%.

Further, the polyene skeleton of the (meth)acrylate compound may also contain a unit represented by the following Formula (II):

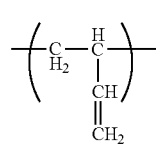

Specifically, for example, the following materials can be preferably used. That is, a liquid polybutadiene urethane (meth)acrylate obtained by urethane addition reaction of 2-hydroxyethyl (meth)acrylate with a hydroxyl group of a liquid polybutadiene via 2,4-tolylene diisocyanate; a liquid polybutadiene acrylate obtained by esterification reaction between a maleic anhydride-added maleated polybutadiene and 2-hydroxyacrylate; a liquid polybutadiene (meth)acrylate obtained by epoxy-esterification reaction between a carboxyl group of a maleated polybutadiene and glycidyl (meth)acrylate; a liquid polybutadiene (meth)acrylate obtained by esterification reaction between an epoxidized polybutadiene, which is produced by allowing an epoxidizing agent to react with a liquid polybutadiene, and (meth) acrylic acid; a liquid polybutadiene (meth)acrylate obtained by dechlorination reaction between a hydroxyl group-containing liquid polybutadiene and (meth)acrylic acid chloride; and a liquid hydrogenated 1,2-polybutadiene (meth) acrylate obtained by modification of liquid hydrogenated 1,2-polybutadiene glycol, which is produced by hydrogenating unsaturated double bonds of a liquid polybutadiene having a hydroxyl group at both molecular terminals, with urethane (meth)acrylate, can be preferably used.

Examples of commercial products thereof include NISSO PB TE-2000, NISSO PB TEA-1000, NISSO PB TE-3000 and NISSO PB TEAI-1000 (all of which are manufactured by Nippon Soda Co., Ltd.); CN301, CN303 and CN307 (all of which are manufactured by SARTOMER); BAC-15 (manufactured by Osaka Organic Chemical Industry Ltd.); BAC-45 (manufactured by Osaka Organic Chemical Industry Ltd.); and EY RESIN BR-45UAS (manufactured by Light Chemical Industries Co., Ltd.).

These (meth)acrylates having a polyene skeleton may be used individually, or a plurality thereof may be used in combination.

Further, in the curable composition for a printed wiring board according to the present invention, a diluent may be incorporated for the purpose of adjusting the viscosity of the composition.

Examples of the diluent include dilution solvents, photo-reactive diluents and heat-reactive diluents. Among these diluents, a photo-reactive diluents are preferred.

Examples of the photo-reactive diluents include compounds having an unsaturated double bond, an oxetanyl group and/or an epoxy group, such as (meth)acrylates, vinyl ethers, ethylene derivatives, styrene, chloromethylstyrene, α-methylstyrene, maleic anhydride, dicyclopentadiene, N-vinylpyrrolidone, N-vinylformamide, xylylene dioxetane, oxetane alcohol, 3-ethyl-3-(phenoxymethyl)oxetane and resorcinol diglycidyl ether.

Thereamong, (meth)acrylates are preferred and monofunctional (meth)acrylates are more preferred. Examples of the monofunctional (meth)acrylates include (meth)acrylates such as methyl (meth)acrylate, ethyl (meth)acrylate, butyl (meth)acrylate, isobutyl (meth)acrylate, lauryl (meth)acrylate, stearyl (meth)acrylate, 2-hydroxyethyl (meth)acrylate, hydroxypropyl (meth)acrylate, hydroxybutyl (meth)acrylate and glycidyl methacrylate; and acryloyl morpholine.

The amount of such diluent to be incorporated is preferably 1 to 30 parts by mass in 100 parts by mass of the curable composition of the present invention.

Further, in the curable composition for a printed wiring board according to the present invention, a tri- or higher functional (meth)acrylate compound (with no hydroxyl group) may be incorporated for the purpose of improving the tackiness of the composition after UV-curing.

Examples of the tri- or higher functional (meth)acrylate compound include polyfunctional acrylates represented by trimethylolpropane triacrylate, trimethylolmethane triacrylate, ethylene oxide-modified trimethylolpropane triacrylate, propylene oxide-modified trimethylolpropane triacrylate, epichlorohydrin-modified trimethylolpropane triacrylate, pentaerythritol tetraacrylate, tetramethylolmethane tetraacrylate, ethylene oxide-modified phosphoric acid triacrylate, propylene oxide-modified phosphoric acid triacrylate, epichlorohydrin-modified glycerol triacrylate, dipentaerythritol hexaacrylate, ditrimethylolpropane tetraacrylate, and silsesquioxane modification products of these acrylates; methacrylate monomers corresponding to these acrylates; and ε-caprolactone-modified trisacryloxyethyl isocyanurate. The amount of such tri- or higher functional (meth)acrylate compound to be incorporated is preferably 1 to 40 parts by mass in 100 parts by mass of the composition of the present invention.

The curable composition for a printed wiring board according to the present invention which comprises the above-described components can be applied to printing methods such as screen printing method, ink-jet method, dip coating method, flow coating method, roll coating method, bar coater method and curtain coating method. Particularly, in cases where the curable composition for a printed wiring board according to the present invention is applied to an ink-jet method, the viscosity thereof at 50° C. is preferably 5 to 50 mPa·s, more preferably 5 to 20 mPa·s. This enables to perform printing smoothly without applying unnecessary burden on an ink-jet printer.

In the present invention, the viscosity is measured at normal temperature (25° C.) or 50° C. in accordance with JIS K2283. As long as the viscosity is 150 mPa·s or less at normal temperature or 5 to 50 mPa·s at 50° C., the curable composition can be printed by an ink-jet printing method.

In cases where the curable composition for a printed wiring board according to the present invention which has the above-described constitution is applied as an ink for ink-jet method, the composition can be printed on a flexible wiring board by a roll-to-roll process. In this case, by installing the below-described light source for photoirradiation in the downstream of an ink-jet printer, a pattern-cured coating film can be formed quickly.

The photoirradiation can be performed with ultraviolet radiation or an active energy ray; however, it is preferably performed with ultraviolet radiation. As the light source for this photoirradiation, for example, a low-pressure mercury lamp, a medium-pressure mercury lamp, a high-pressure mercury lamp, an ultrahigh-pressure mercury lamp, a xenon lamp or a metal halide lamp is appropriate. In addition, an electron beam, α-ray, β-ray, γ-ray, X-ray, neutron beam or the like can also be used.

Further, after the photoirradiation, as required, the thus photoirradiated curable composition is cured by heating. Here, the heating temperature is, for example, 80 to 200° C. By performing the heating in this temperature range, the curable composition can be sufficiently cured. The heating time is, for example, 10 to 100 minutes.

Moreover, the curable composition for a printed wiring board according to the present invention is capable of forming a pattern-cured coating film which exhibits excellent adhesion to a printed wiring board that comprises a plastic substrate containing polyimide or the like as a main component and a conductor circuit arranged thereon, as well as excellent properties in terms of solder heat resistance, chemical resistance, solvent resistance, pencil hardness, resistance to electroless gold plating, bending characteristics and the like.

EXAMPLES

The present invention will now be described concretely by way of examples thereof; however, the present invention is not restricted thereto by any means. It is noted here that, unless otherwise specified, "part(s)" means "part(s) by mass" in the followings.

Examples 1 to 5 and Comparative Examples 1 and 2

The components shown in Table 1 were blended and pre-mixed at the respective ratios (unit: parts) shown in Table 1 using a stirrer to prepare curable compositions.

For each of the thus obtained curable compositions and cured coating films thereof, the following properties were evaluated.

1. Precipitation After 1 Month

The curable compositions for a printed wiring board, which were prepared in accordance with the respective formulations of Examples 1 to 5 and Comparative Examples 1 and 2 shown in Table 1, were each added to a transparent glass vial container in an appropriate amount. Then, the container was hermetically sealed and left to stand for 1 month at 25° C. Thereafter, the presence or absence of a precipitate was visually checked and evaluated based on the following evaluation criteria.
  ○: No precipitate was observed and the composition was uniform.
  x: A precipitate was observed.
  —: No precipitate was generated (because the composition contained no filler).
The evaluation results are shown in Table 2.

2. Dryness to Touch After Curing with UV

The curable compositions for a printed wiring board of Examples 1 to 5 and Comparative Examples 1 and 2, which were left to stand for 1 month and used in the above 1, were each coated on a polyimide substrate (UPILEX 25S) using a 30 μm applicator (manufactured by Erichsen GmbH & Co. KG) and subsequently cured under a high-pressure mercury lamp (HMW-713, manufactured by ORC Manufacturing Co., Ltd.) at 150 mJ/cm$^2$. For each of the resulting coating films, the surface dryness to touch was evaluated,
  ○: The coating film surface had no tackiness.
  x: The curable composition was not cured, remaining in a liquid form.
The evaluation results are shown in Table 2.

3. Adhesion with Polyimide

The curable compositions for a printed wiring board of Examples 1 to 5 and Comparative Examples 1 and 2, which were left to stand for 1 month and used in the above 1, were each coated on a polyimide substrate (UPILEX 25S) using a 30 μm applicator (manufactured by Erichsen GmbH & Co. KG) and subsequently cured under a high-pressure mercury lamp (HMW-713, manufactured by ORC Manufacturing Co., Ltd.) at 150 mJ/cm$^2$. Thereafter, in a 150° C. hot air circulation-type drying oven, the thus cured composition was heat-treated for 60 minutes. The thus prepared sample was subjected to a cross-cut tape peeling test (JIS K5600).
  ○: No detachment was observed.
  x: Detachment was observed.
The evaluation results are shown in Table 2.

4. Adhesion with FR-4

The curable compositions for a printed wiring board of Examples 1 to 5 and Comparative Examples 1 and 2, which were left to stand for 1 month and used in the above 1, were each coated on a FR-4 substrate using a 30 μm applicator (manufactured by Erichsen GmbH & Co. KG) and subsequently cured under a high-pressure mercury lamp (HMW-713, manufactured by ORC Manufacturing Co., Ltd.) at 150 mJ/cm$^2$. Thereafter, in a 150° C. hot air circulation-type drying oven, the thus cured composition was heat-treated for 60 minutes. The thus prepared sample was subjected to a cross-cut tape peeling test (JIS K5600).
  ○: No detachment was observed.
  x: Detachment was observed.
The evaluation results are shown in Table 2.

5. Adhesion with Copper

The curable compositions for a printed wiring board of Examples 1 to 5 and Comparative Examples 1 and 2, which were left to stand for 1 month and used in the above 1, were each coated on a copper foil using a 30 μm applicator (manufactured by Erichsen GmbH & Co. KG) and subsequently cured under a high-pressure mercury lamp (HMW-713, manufactured by ORC Manufacturing Co., Ltd.) at 150 mJ/cm$^2$. Thereafter, in a 150° C. hot air circulation-type drying oven, the thus cured composition was heat-treated for 60 minutes. The thus prepared sample was subjected to a cross-cut tape peeling test.
  ○: No detachment was observed.
  x: Detachment was observed.
The evaluation results are shown in Table 2.

6. Evaluation of Pencil Hardness (Surface Hardness)

For each of the cured coating films obtained in the above 5, the pencil hardness of the surface was measured in accordance with JIS K5600-5-4.

7. Bending Resistance

A flexible copper-clad laminate constituted by a 25 μm thick polyimide film and a comb-shaped copper wire (wiring pattern) formed by a 12 μm thick copper foil was prepared (110 mm in length, 60 mm in width, copper wire width/space between copper wires=200 μm/200 μm). On this flexible copper-clad laminate substrate, each curable composition was coated to a film thickness of 15 μm by ink-jet printing using a piezo-type ink-jet printer. Here, immediately after the printing, the printed composition was pre-cured with UV using a high-pressure mercury lamp mounted on the ink-jet head. Then, the resultant was heat-cured at 150° C. for 1 hour to obtain a test piece. Using an MIT (Massachusetts Institute of Technology) tester, the thus cured test piece was repeatedly bent under the below-described conditions with its protective film facing inside, and the number of cycles at which electrical conduction was no longer observed was determined. For each evaluation, 3 test pieces were tested and the average number of cycles at which electrical conduction was no longer observed was calculated. The test conditions and evaluation criteria were as follows.

MIT Resistance Test Conditions
Load: 500 gf
Angle: opposing angle of 135°
Rate: 175 times/minute
Tip: R0.38 mm cylinder Evaluation Criteria
○: 50 cycles or more
x: less than 50 cycles 8. Solvent Resistance The cured coating films obtained in the above 5 were immersed in acetone for 30 minutes, and the condition of each coating film was visually observed and evaluated based on the following criteria.

Evaluation Criteria
○: Absolutely no change was observed.
x: Swelling or detachment of the coating film was observed.

9. Chemical Resistance

The cured coating films obtained in the above 5 were immersed in 5 wt % aqueous sulfuric acid solution for 10 minutes, and the condition of each coating film was visually observed and evaluated based on the following criteria.

Evaluation Criteria
○: Absolutely no change was observed.
x: Swelling or detachment of the coating film was observed.

10. Solder Heat Resistance

In accordance with the method of JIS C-5012, the cured coating films obtained in the above 5 were each immersed in a 260° C. solder bath for 10 seconds and then subjected to a peeling test using a cellophane adhesive tape. Thereafter, the condition of each coating film was visually observed and evaluated based on the following criteria.

Evaluation Criteria
○: The coating film showed no change.
Δ: The coating film showed some changes.
x: The coating film was detached.

11. Resistance to Electroless Plating

Using a commercially available electroless nickel plating bath and electroless gold plating bath, the cured coating films obtained in the above 5 were each plated at a nickel thickness of 0.5 μm and a gold thickness of 0.03 μm. Then, the surface condition of each cured coating film was observed. The evaluation criteria were as follows.

Evaluation Criteria
○: Absolutely no change was observed.
x: Prominent whitening or clouding was observed.

TABLE 1

|  | Example 1 | Example 2 | Example 3 | Example 4 | Example 5 | Comparative Example 1 | Comparative Example 2 |
|---|---|---|---|---|---|---|---|
| Bifunctional acrylate monomer*1 | 35 | 35 | 35 | 35 | 35 | 35 | 35 |
| Hydroxyl group-containing acrylate monomer*2 | 45 | 45 | 45 | 45 | 45 | 45 | 45 |
| Trifunctional acrylate monomer*3 | 10 | 10 | 10 | 10 | 10 | 10 | 10 |
| Trifunctional methacrylate monomer*4 | 2.5 | 2.5 | 2.5 | 2.5 | 2.5 | 2.5 | 2.5 |
| Photo initiator*5 | 1 | 1 | 1 | 1 | 1 | 1 | 1 |
| Photo initiator*6 | 2 | 2 | 2 | 2 | 2 | 2 | 2 |
| Photo initiator*7 | 2 | 2 | 2 | 2 | 2 | 2 | 2 |
| Thermosetting component*8 | 10 | 10 | 10 | 10 | 10 | 10 | 10 |
| Wetting dispersant*9 | 0.5 | 0.5 | 0.5 | 0.5 | 0.5 | 0.5 |  |
| Surface tension-adjusting agent*10 | 0.1 | 0.1 | 0.1 | 0.1 | 0.1 | 0.1 | 0.1 |
| Silica*11 | 10 | 20 | 30 |  |  |  |  |
| Aluminum hydroxide*12 |  |  |  | 20 |  |  |  |
| Talc*13 |  |  |  |  | 20 |  |  |
| Barium sulfate*14 |  |  |  |  |  | 20 |  |
| Σ | 118.1 | 128.1 | 138.1 | 108.1 | 108.1 | 108.1 | 107.6 |
| Amount of added filler (%) | 8.47 | 15.6 | 21.7 | 18.5 | 18.5 | 0.0 | 0.0 |

The product names and abbreviations used in Table 1 are as follows.
*1DPGDA; dipropylene glycol diacrylate (manufactured by BASF Japan Ltd.)
*24HBA; 4-hydroxybutyl acrylate (manufactured by Nippon Kasei Chemical Co., Ltd.)
*3LAROMER LR8863, EO-modified trimethylolpropane triacrylate (manufactured by BASF Japan Ltd.)
*4EBECRYL 168 (manufactured by Daicel-Allnex Ltd.)
*5DAROCUR 1173, 2-hydroxy-2-methyl-1-phenyl-propane-1-one (manufactured by BASF Japan Ltd.)
*62-ethylAQ, 2-ethylanthraquinone (manufactured by BASF Japan Ltd.)
*7IRGACURE 819, bis(2,4,6-trimethylbenzoyl)-phenylphosphine oxide (manufactured by BASF Japan Ltd.)
*8BI7982, block isocyanate (manufactured by Baxenden Chemicals Ltd.)
*9DISPERBYK-111, wetting dispersant (manufactured by BYK Chemie Japan))
*10BYK-307, silicon-based additive (manufactured by BYK Chemie Japan)
*11NIPSIL SS-70, specific gravity = 2.2 (manufactured by Tosoh Silica Corporation)
*12HIGILITE H43, specific gravity = 2.5 (manufactured by Showa Denko K.K.)
*13LMP-100, specific gravity = 2.7 (manufactured by Fuji Talc Industrial Co., Ltd.)
*14B-30, specific gravity = 4.5 (manufactured by Sakai Chemical Industry Co., Ltd.)

TABLE 2

|  | Example 1 | Example 2 | Example 3 | Example 4 | Example 5 | Comparative Example 1 | Comparative Example 2 |
|---|---|---|---|---|---|---|---|
| Precipitation after 1 month | ○ | ○ | ○ | ○ | ○ | x | — |
| Dryness to touch after curing with UV | ○ | ○ | ○ | ○ | ○ | ○ | ○ |
| Adhesion with polyimide | ○ | ○ | ○ | ○ | ○ | ○ | ○ |
| Adhesion with FR-4 | ○ | ○ | ○ | ○ | ○ | ○ | ○ |
| Adhesion with copper | ○ | ○ | ○ | ○ | ○ | ○ | ○ |
| Pencil hardness | 3H | 4H | 4H | 4H | 4H | 2H | H |
| Bending resistance | ○ | ○ | ○ | ○ | ○ | ○ | ○ |
| Solvent resistance | ○ | ○ | ○ | ○ | ○ | x | x |
| Chemical resistance | ○ | ○ | ○ | ○ | ○ | x | x |
| Solder heat resistance | ○ | ○ | ○ | ○ | ○ | x | x |
| Resistance to electroless gold plating | ○ | ○ | ○ | ○ | ○ | x | x |

As shown in Table 2, the curable compositions for a printed wiring board according to the present invention that were obtained in Examples 1 to 5 yielded good results for all of the following properties: precipitation after 1 month, dryness to touch after curing with UV, adhesion with polyimide, adhesion with copper, pencil hardness, bending resistance, solvent resistance, chemical resistance, solder heat resistance and resistance to electroless gold plating.

Particularly, in Examples 2 to 5 where the component A was incorporated in an amount of 5 to 30 parts by mass with respect to 100 parts by mass of each composition, extremely good pencil hardness was observed.

On the other hand, in Comparative Example 1 where a filler having a specific gravity of higher than 3 was used in place of the component A of the present invention, precipitation was observed after the composition was left to stand for 1 month. In addition, in both of Comparative Example 1 and Comparative Example 2 which lacked the component A of the present invention, it was confirmed that the pencil hardness, solvent resistance, chemical resistance, solder heat resistance and resistance to electroless gold plating were all poor and satisfactory properties were thus not attained.

INDUSTRIAL APPLICABILITY

As described above, the curable composition for a printed wiring board according to the present invention is capable of forming a fine pattern that is excellent in various properties required as a solder resist, such as solder heat resistance, chemical resistance, pencil hardness and resistance to electroless gold plating. Further, in order to make a composition sprayable by an ink-jet method, the composition is required to have a low viscosity. In general, low-viscosity photocurable compositions are considered to be poor in terms of properties such as adhesiveness and heat resistance; however, the composition of the present invention, despite having a low-viscosity, can also be suitably used for forming a solder resist pattern on a printed wiring board by an ink-jet method. Therefore, the composition of the present invention can be utilized in applications such as UV-molded materials, materials for optical fabrication and 3D ink-jet materials. Moreover, the photocurable composition for a printed wiring board according to the present invention can also be used as an ink for a resist other than a solder resist, such as an etching resist ink, a solder resist ink, a plating resist ink or a marking ink.

The invention claimed is:

1. A curable composition for a printed wiring board, comprising:
    a filler having a specific gravity of 3 or less;
    a bifunctional (meth)acrylate compound;
    a hydroxyl group-containing (meth)acrylate compound; and
    a photopolymerization initiator,
    wherein the hydroxyl group-containing (meth)acrylate compound is in an amount of 5 to 50 parts by mass with respect to 100 parts by mass of the curable composition.

2. The curable composition for a printed wiring board according to claim 1, wherein the filler is an inorganic filler.

3. The curable composition for a printed wiring board according to claim 1, wherein the filler is particles having a maximum particle size in a range of 0.1 to 5 μm.

4. The curable composition for a printed wiring board according to claim 1, wherein the bifunctional (meth)acrylate compound has a viscosity of 5 to 50 mPa·s at 25° C.

5. The curable composition for a printed wiring board according to claim 2, wherein the bifunctional (meth)acrylate compound has a viscosity of 5 to 50 mPa·s at 25° C.

6. The curable composition for a printed wiring board according to claim 1, further comprising a thermosetting component.

7. The curable composition for a printed wiring board according to claim 1, wherein the curable composition has a viscosity in a range of 5 to 50 mPa·s at 50° C.

8. A cured coating film obtained by photoirradiating the curable composition of claim 1.

9. A printed wiring board, comprising:
    a substrate; and
    a pattern-cured coating film obtained by printing the curable composition of claim 1 on the substrate and subsequently photoirradiating the curable composition primed on the substrate.

10. A printed wiring board, comprising:
    a substrate; and
    a pattern-cured coating film obtained by printing the curable composition of claim 1 on the substrate by an ink jet printing method and subsequently photoirradiating the curable composition printed on the substrate.

11. The printed wiring board according to claim 9, wherein the substrate is a plastic substrate.

12. The printed wiring board according to claim 10, wherein the substrate is a plastic substrate.

13. The curable composition for a printed wiring board according to claim 1, wherein the filler is an inorganic filler in an amount of 5 to 30 parts by mass with respect to 100 parts by mass of the curable composition.

14. The curable composition for a printed wiring board according to claim 13, wherein the filler is particles having a maximum particle size in a range of 0.1 to 5 μm.

15. The curable composition for a printed wiring board according to claim 1, wherein the bifunctional (meth)acrylate compound is in an amount of 20 to 80 parts by mass with respect to 100 parts by mass of the curable composition.

16. The curable composition for a printed wiring board according to claim 1, wherein the bifunctional (meth)acrylate compound has a viscosity of 5 to 30 mPa·s at 25° C.

17. The curable composition for a printed wiring board according to claim 1, further comprising a thermosetting component in an amount of 1 to 30 parts by mass with respect to 100 parts by mass of the curable composition.

18. The curable composition for a printed wiring board according to claim 1, wherein the bifunctional (meth)acrylate compound is in an amount of 40 to 70 parts by mass with respect to 100 parts by mass of the curable composition.

19. The curable composition for a printed wiring board according to claim 1, wherein the photopolymerization initiator is in an amount of 0.5 to 10 parts by mass with respect to 100 parts by mass of the curable composition.

20. The curable composition for a printed wiring board according to claim 1, wherein the filler is an inorganic filler in an amount of 5 to 30 parts by mass with respect to 100 parts by mass of the curable composition and is particles having a maximum particle size in a range of 0.1 to 5 μm, the bifunctional (meth)acrylate compound has a viscosity of 5 to 50 mPa·s at 25° C. and is in an amount of 20 to 80 parts by mass with respect to 100 parts by mass of the curable composition, and the photopolymerization initiator is in an amount of 0.5 to 10 parts by mass with respect to 100 parts by mass of the curable composition.

* * * * *